United States Patent
Hao et al.

(10) Patent No.: US 9,433,102 B2
(45) Date of Patent: Aug. 30, 2016

(54) TOUCH SCREEN PANEL AND METHOD FOR MANUFACTURING THE SAME, AND DISPLAY DEVICE

(71) Applicant: BOE TECHNOLOGY GROUP CO., LTD., Beijing (CN)

(72) Inventors: Guangye Hao, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/361,580

(22) PCT Filed: Dec. 18, 2013

(86) PCT No.: PCT/CN2013/089755
§ 371 (c)(1),
(2) Date: May 29, 2014

(87) PCT Pub. No.: WO2015/027637
PCT Pub. Date: Mar. 5, 2015

(65) Prior Publication Data
US 2015/0062454 A1    Mar. 5, 2015

(30) Foreign Application Priority Data
Aug. 30, 2013   (CN) .......................... 2013 1 0390544

(51) Int. Cl.
*G06F 3/041*   (2006.01)
*H05K 3/06*   (2006.01)
*G06F 3/044*   (2006.01)

(52) U.S. Cl.
CPC .............. *H05K 3/064* (2013.01); *G06F 3/044* (2013.01); *G06F 2203/04103* (2013.01); *G06F 2203/04107* (2013.01); *G06F 2203/04111* (2013.01)

(58) Field of Classification Search
CPC ...... G06F 3/041; G06F 3/0412; G06F 3/044; G06F 2203/04103; G06F 2203/04107; G06F 2203/04111; H03K 17/9618; H01J 9/00; H05K 3/064
See application file for complete search history.

(56) References Cited

U.S. PATENT DOCUMENTS

2010/0066650 A1   3/2010   Lee et al.
2011/0069033 A1   3/2011   Meng et al.
(Continued)

FOREIGN PATENT DOCUMENTS

CN   101699377 A   4/2010
CN   101751181 A   6/2010
(Continued)

OTHER PUBLICATIONS

First Office Action regarding Chinese application No. 201310390544.9, dated Oct. 22, 2015. Translation provided by Dragon Intellectual Property Law Firm.
(Continued)

*Primary Examiner* — Lun-Yi Lao
*Assistant Examiner* — Johny Lau
(74) *Attorney, Agent, or Firm* — Harness, Dickey & Pierce, P.L.C.

(57) ABSTRACT

The present invention discloses a touch screen panel and a method for manufacturing the same, and a display device. The method comprises: forming patterns of a bridging layer and a shielding layer on a substrate by one patterning process; then forming a pattern of an insulating layer on the shielding layer; and forming a pattern of a touch electrode layer on the insulating layer. In the embodiments of the invention, the patterning of the bridging layer and the shielding layer is accomplished simultaneously in one patterning process, thereby the number of patterning times during the manufacture process can be reduced, the manufacture efficiency of the touch screen panel can be improved, and the production cost can be lowered.

17 Claims, 6 Drawing Sheets

(56) References Cited

U.S. PATENT DOCUMENTS

| | | | | |
|---|---|---|---|---|
| 2011/0205168 A1* | 8/2011 | Jun | ............... | G06F 3/044 345/173 |
| 2013/0057793 A1 | 3/2013 | Uchida | | |
| 2015/0009422 A1* | 1/2015 | Tung | ............... | G06F 3/041 349/12 |
| 2015/0027870 A1* | 1/2015 | Yang | ............... | G96F 3/041 200/5 R |

FOREIGN PATENT DOCUMENTS

| CN | 101751190 A | 6/2010 |
|---|---|---|
| CN | 102023770 A | 4/2011 |
| CN | 102446047 A | 5/2012 |
| CN | 102681712 A | 9/2012 |
| CN | 102693028 A | 9/2012 |
| CN | 102799311 A | 11/2012 |
| CN | 202533920 U | 11/2012 |
| CN | 103019496 A | 4/2013 |
| CN | 203480463 U | 3/2014 |
| EP | 2500803 A2 | 9/2012 |

OTHER PUBLICATIONS

Written Opinion of the International Searching Authority for international application No. PCT/CN2013/089755.

International Search Report and Written Opinion mailed Jun. 23, 2014 regarding PCT/CN2013/089761. Translation provided by Dragon Intellectual Property Law Firm.

First Office Action regarding Chinese application No. 201310390465.8, dated Oct. 8, 2015. Translation provided by Dragon Intellectual Property Law Firm.

Second Office Action of Chinese application No. 201310390465.8, dated Apr. 1, 2016. Translation provided by Dragon Intellectual Property Law Firm.

International Search Report and Written Opinion mailed Jun. 9, 2014 regarding PCT/CN2013/089694. Translation provided by Dragon Intellectual Property Law Firm.

First Office Action of Chinese application No. 201310390550.4, dated Oct. 14, 2014. Translation provided by Dragon Intellectual Property Law Firm.

\* cited by examiner

Prior Art

Fig. 1a

Prior Art

TOUCH SCREEN PANEL AND METHOD FOR MANUFACTURING THE SAME, AND DISPLAY DEVICE

CROSS REFERENCE TO RELATED APPLICATIONS

This application is the U.S. national phase of PCT Application No. PCT/CN2013/089755 filed on Dec. 18, 2013, which claims priority to Chinese Patent Application No. 201310390544.9 filed on Aug. 30, 2013, the disclosures of which are incorporated in their entirety by reference herein.

FIELD OF THE INVENTION

The present invention relates to the field of touch technologies, and in particular, to a touch screen panel and a method for manufacturing the same, and a display device.

DESCRIPTION OF THE PRIOR ART

With the rapid development of display technologies, touch screen panel has been gradually popularized in people's life. At present, the touch screen panel may be divided according to its operating principle into: resistive touch screen panel, capacitive touch screen panel, infrared touch screen panel, surface acoustic wave touch screen panel, electromagnetic touch screen panel, vibration wave sensitive touch screen panel and inhibited total internal reflection optical sensitive touch screen panel. Among them, capacitive touch screen panel is pursued as the new favorite of the industry due to its advantages of unique touch principle, high sensitivity, long life and high light transmittance, etc.

Figure 1A:
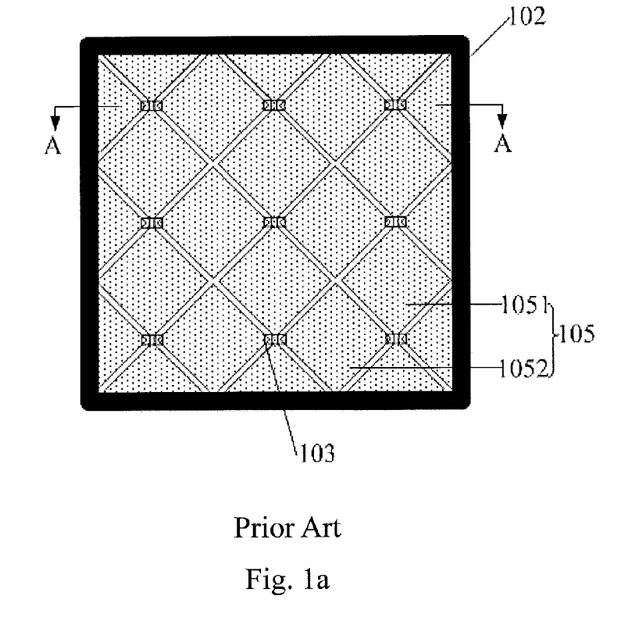
FIG. 1a is a schematic top view of an OGS touch module of the prior art.
Figure 1B:
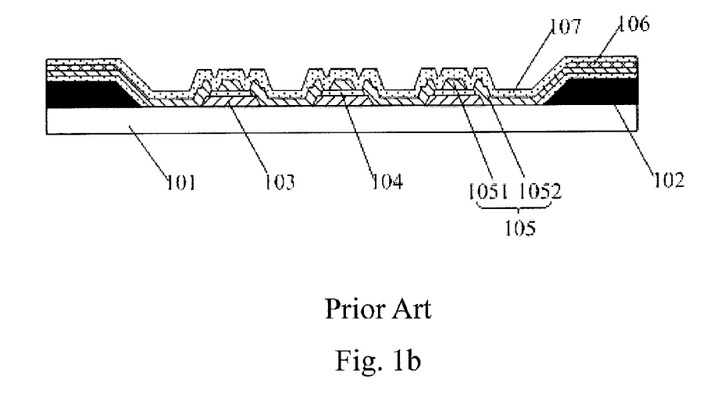

For a One Glass Solution (OGS) touch module that is widely used currently, a single-layer touch conductive film and a sensor are directly formed on a substrate. As shown in FIG. 1a and FIG. 1b, the specific structure of the OGS touch module includes a shielding layer (blackmatrix, BM for short) 102, a bridging layer (Bridge) 103, an insulating layer (Overcoat, OC for short) 104, a touch electrode layer 105, a peripheral wiring 106 and a passivation layer 107 that are stacked in turn on a substrate 101; wherein, the touch electrode layer 105 specifically includes a touch sensing electrode 1051 and a touch driving electrode 1052 that are formed crosswise and insulated from each other, the touch sensing electrode 1051 and the touch driving electrode 1052 have a rhombic pattern, adjacent touch driving electrodes 1052 that are disconnected from each other are bridged by the bridging layer 103, the touch sensing electrode 1051 and the touch driving electrode 1052 are connected with the corresponding peripheral wiring 106 in a non-display region of the touch module, and the peripheral wiring 106 will transmit a signal on the touch electrode layer 105 to the corresponding IC chip for analyzing.

During the preparation of OGS touch module with the above structure, six masks are required for patterning: the first mask is used for forming the pattern of the shielding layer 102, the second mask is used for forming the pattern of the bridging layer 103, the third mask is used for forming the pattern of the insulating layer 104, the fourth mask is used for forming the pattern of the touch electrode layer 105 (including the touch sensing electrode 1051 and the touch driving electrode 1052), the fifth mask is used for forming the pattern of the peripheral wiring 106, and the sixth mask is used for forming the pattern of the passivation layer 107. In the above preparing process, the number of masks used is large, and each mask is required to be accurately aligned with the substrate when it is used, thus the production efficiency is lowered and the production cost is increased.

SUMMARY OF THE INVENTION

The embodiments of the invention provide a method for manufacturing a touch screen panel, which solves the problem of the prior art that the number of times the masks are used is large during the manufacturing of an OGS touch module and the production efficiency is low. Moreover, the embodiments of the invention further provides a touch screen panel with a novel structure that is prepared by the method according to the invention, and a display device containing the touch screen panel.

According to an embodiment of the invention, there provides a method for manufacturing a touch screen panel, comprising:

forming patterns of a bridging layer and a shielding layer on a substrate by one patterning process;

forming a pattern of an insulating layer on the shielding layer and the bridging layer; and forming a pattern of a touch electrode layer on the insulating layer, wherein, the touch electrode layer comprises a touch sensing electrode and a touch driving electrode that are formed crosswise and insulated from each other, and the bridging layer bridges the adjacent touch driving electrodes or the adjacent touch sensing electrodes.

According to an embodiment of the invention, there provides a touch screen panel, comprising: a substrate, and a bridging layer, a shielding layer, an insulating layer and a touch electrode layer that are stacked in turn on the substrate; wherein:

the bridging layer, the insulating layer and the touch electrode layer are located in a touch region and a non-touch region of the touch screen panel, wherein the touch electrode layer comprises a touch sensing electrode and a touch driving electrode that are formed crosswise on the same layer and insulated from each other, and the bridging layer bridges the adjacent touch driving electrodes or the adjacent touch sensing electrodes; and the shielding layer is located in the non-touch region of the touch screen panel.

According to an embodiment of the invention, there provides a display device, comprising the above touch screen panel according to the embodiments of the invention.

The above embodiments of the invention have the following advantageous effects. The embodiment of the invention provides a method for manufacturing a touch screen panel, which comprises: forming patterns of a bridging layer and a shielding layer on a substrate by one patterning process; then forming a pattern of an insulating layer on the shielding layer; and forming a pattern of a touch electrode layer on the insulating layer. In the embodiments of the invention, the patterning of the bridging layer and the shielding layer is accomplished simultaneously in one patterning process, the number of patterning times during the manufacture process can be reduced, the manufacture efficiency of the touch screen panel can be improved, and the production cost can be lowered. Moreover, the embodiments of the invention further provides a touch screen panel with a novel structure that is prepared by the method according to the invention and a display device containing the touch screen panel.

BRIEF DESCRIPTION OF THE DRAWINGS

FIG. 1b is a schematic sectional view taken along direction A-A in FIG. 1a;

DETAILED DESCRIPTION OF THE PREFERRED EMBODIMENTS

The specific embodiments of a touch screen panel and a method for manufacturing the same, and a display device will be illustrated in detail below in conjunction with the drawings.

In the drawings, the thickness of each layer of thin film, and the size and the shape of each region do not reflect the real proportion; instead, they are only used for schematically illustrating the contents of the invention.

Figure 2:
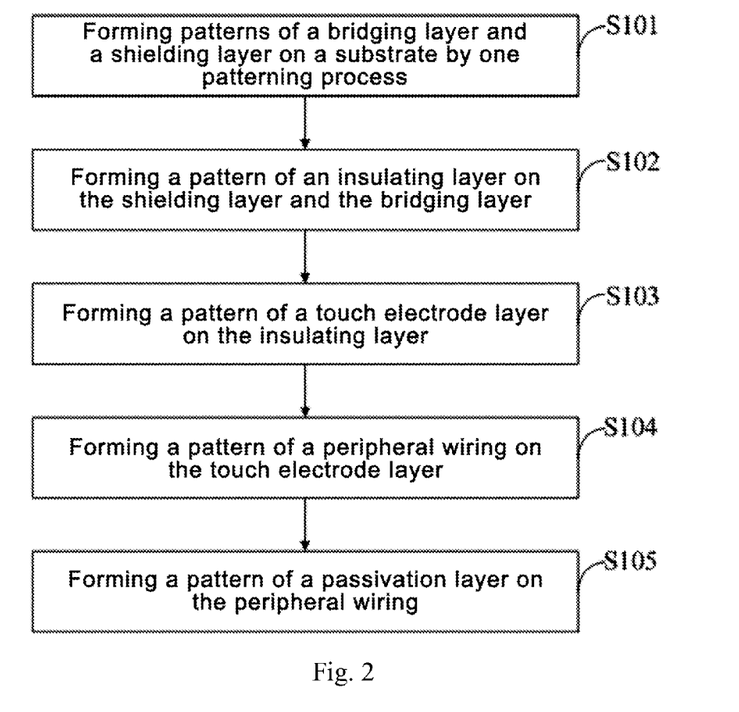
FIG. 2 is a flow chart of a method for manufacturing a touch screen panel according to one embodiment of the invention.
Figure 3A:
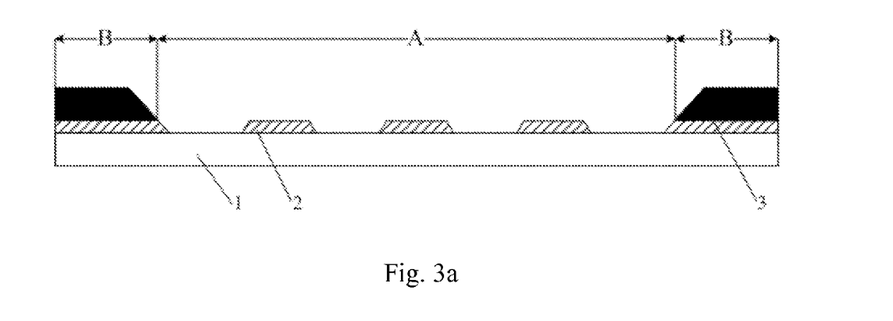
FIG. 3a is a schematic sectional view after a bridging layer and a shielding layer are formed on a substrate according to one embodiment of the invention.

According to an embodiment of the invention, there provides a method for manufacturing a touch screen panel, as shown in FIG. 2, which specifically includes the steps of:

Step S101: forming patterns of a bridging layer 2 and a shielding layer 3 on a substrate 1 by one patterning process. As shown in FIG. 3a, the shielding layer 3 only has a pattern in a non-touch region B of the touch screen panel, and the bridging layer 2 has a pattern in both a touch region A and a non-touch region B.

Figure 3B:
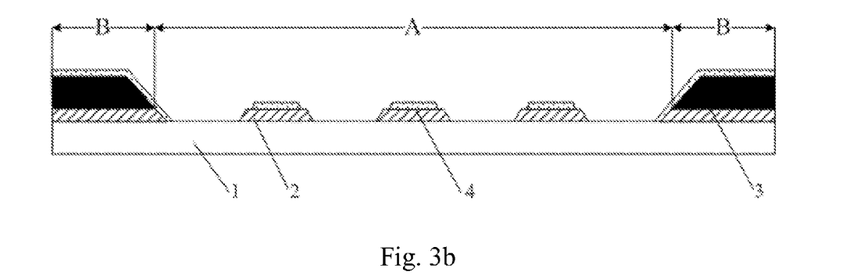
FIG. 3b is a schematic sectional view after an insulating layer is formed according to one embodiment of the invention.

Step S102: forming a pattern of an insulating layer 4 on the shielding layer 3 and the bridging layer 2. As shown in FIG. 3b, the insulating layer 4 has a pattern in both the touch region A and the non-touch region B.

Figure 3C:
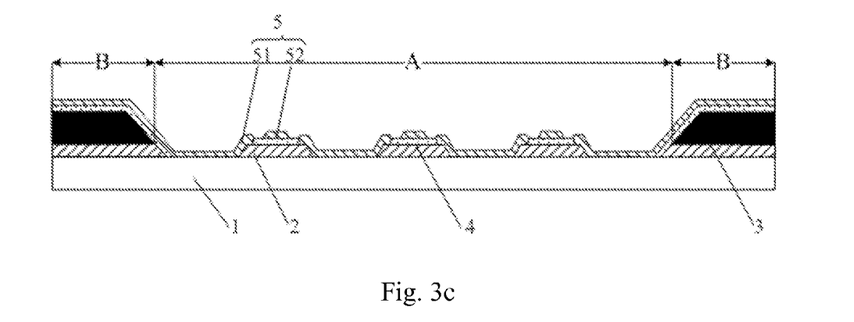
FIG. 3c is a schematic sectional view after a touch electrode layer is formed according to one embodiment of the invention.

Step S103: forming a pattern of a touch electrode layer 5 on the insulating layer 4. As shown in FIG. 3c, the touch electrode layer 5 has a pattern in both the touch region A and the non-touch region B. The touch electrode layer 5 includes a touch sensing electrode 51 and a touch driving electrode 52 that are formed crosswise and insulated from each other, and the bridging layer 2 bridges the adjacent touch driving electrodes 52 or the adjacent touch sensing electrodes 51. In FIG. 3c, it is illustrated by an example in which the bridging layer 2 bridges the adjacent touch sensing electrodes 51.

Moreover, in the above method according to the embodiment of the invention, as shown in FIG. 2, it may further include a Step S104 below.

Figure 3D:
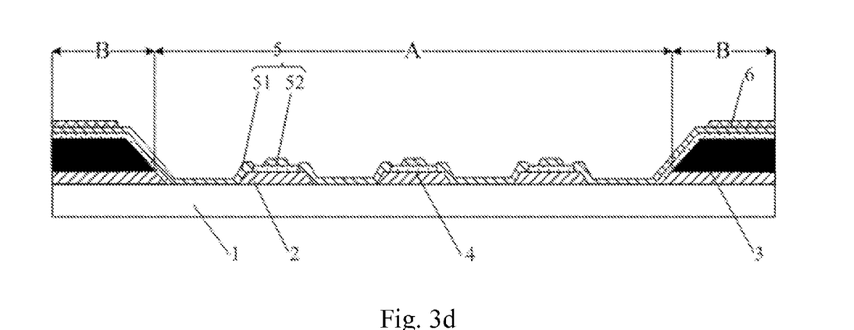
FIG. 3d is a schematic sectional view after a peripheral wiring is formed according to one embodiment of the invention.

Step S104: forming a pattern of a peripheral wiring 6 on the touch electrode layer 5, as shown in FIG. 3d. Specifically, the peripheral wiring 6 may be only formed in the non-touch region B of the touch screen panel that corresponds to the region with the pattern of the shielding layer 3, and the shielding layer 3 may shield the peripheral lead (i.e., the peripheral wiring 6) of the touch screen panel. Moreover, the peripheral wiring may be a metal wiring because metal has a small resistance and a better conduction effect, which is favorable for improving the touch sensitivity of the touch screen panel.

Moreover, in the above method according to the embodiments of the invention, as shown in FIG. 2, it may further include a Step S105 below.

Figure 3E:
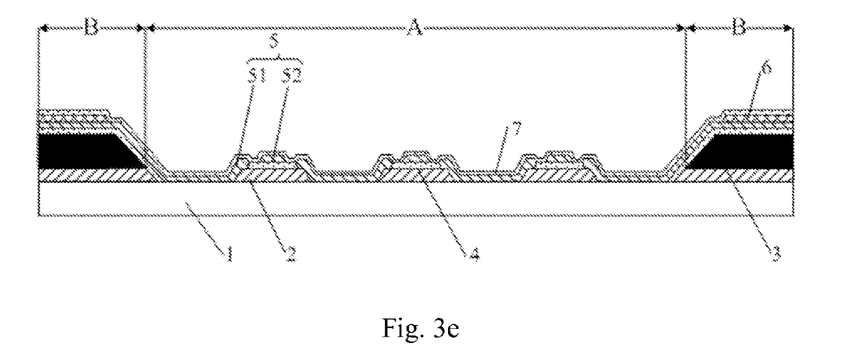
FIG. 3e is a schematic sectional view after a passivation layer is formed according to one embodiment of the invention.

Step S105: forming a pattern of a passivation layer 7 on the peripheral wiring 6, as shown in FIG. 3e. The passivation layer 7 has patterns in both the touch region A and the non-touch region B.

In the above method for manufacturing a touch screen panel according to the embodiment of the invention, the patterning of the bridging layer and the shielding layer is accomplished simultaneously in one patterning process, and in comparison with the prior art in which six patterning processes are required, the number of patterning times during the manufacture process can be reduced, the manufacture efficiency of the touch screen panel can be improved, and the production cost can be lowered.

Moreover, in the above method for manufacturing a touch screen panel according to the embodiment of the invention, the Step S103 of forming a pattern of a touch electrode layer on the insulating layer and the Step S104 of forming a pattern of a peripheral wiring on the touch electrode layer may also be accomplished by one patterning process. The patterns of the touch electrode layer and the peripheral wiring are formed on the insulating layer by one patterning process, that is, the patterning of the touch electrode layer and the peripheral wiring is accomplished by one mask process in one patterning process. Thus, in the manufacturing method according to the embodiments of the invention, the preparation of a touch screen panel may be accomplished by four patterning processes; in comparison with the prior art in which six patterning processes are required, the number of patterning times during the manufacture process can be further reduced, the manufacture efficiency of the touch screen panel can be improved, and the production cost can be lowered.

The above Steps S101-S105 will be illustrated in detail below respectively by a four-time patterning process.

For easy illustration, in the following description of the embodiments of the invention, the masks used in Steps S101-S105 will be described as mask 1, mask 2, mask 3 and mask 4.

Figure 4A:
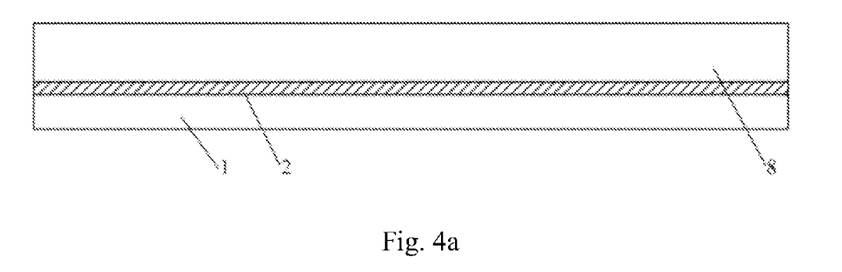
FIG. 4a-FIG. 4c are schematic sectional views showing each step of a process for forming a bridging layer and a shielding layer by one patterning process according to one embodiment of the invention.

Specifically, in the above Step S101, forming the patterns of a bridging layer 2 and a shielding layer 3 on a substrate 1 by one patterning process is preferably implemented in the following mode:

First of all, a thin film of a bridging layer 2 is formed on a substrate 1, and a photoresist 8 is formed on the thin film of the bridging layer 2, as shown in FIG. 4a.

Figure 4B:
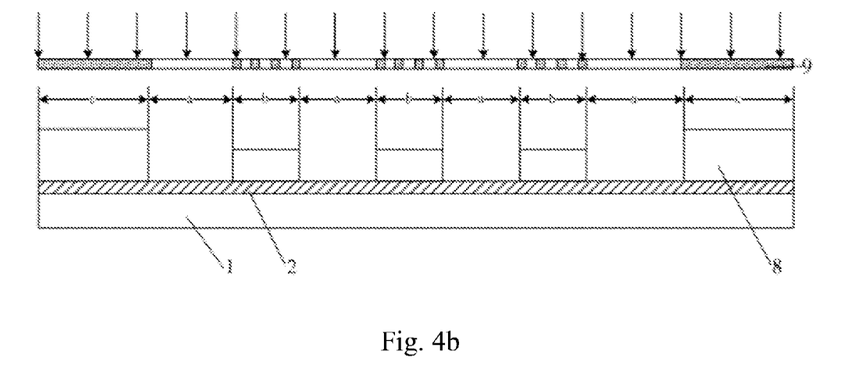

Then, the photoresist 8 is exposed through a mask 1 (the first mask 9) and developed, and a first photoresist completely-removed region a, a first photoresist partially-reserved region b and a first photoresist completely-reserved region c are obtained, as shown in FIG. 4b. During specific implementation, the first mask 9 may be a halftone mask or a graytone mask. The first photoresist partially-reserved region b corresponds to the pattern region that forms the bridging layer 2, the first photoresist completely-reserved region c corresponds to the pattern region that forms the shielding layer 3.

Finally, the first photoresist completely-removed region a, the first photoresist partially-reserved region b and the first photoresist completely-reserved region c are etched respectively to form the patterns of the bridging layer 2 and the shielding layer 3.

Specifically, the above photoresist 8 is a black photosensitive resin, thus the photoresist may be directly used as a shielding layer, and the process for separately manufacturing a shielding layer may be omitted, the number of masks can be reduced, and the production cost can be lowered.

Figure 4C:
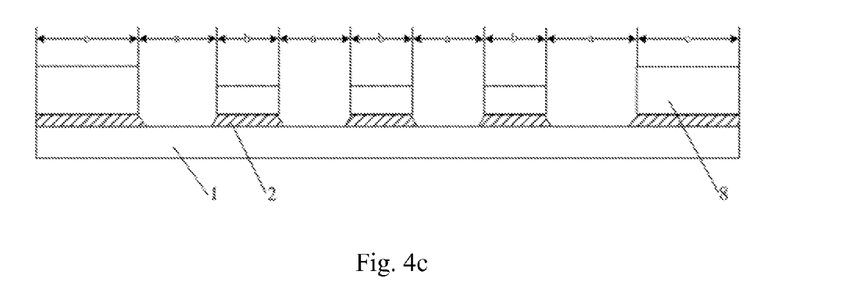

Moreover, the step of etching the first photoresist completely-removed region a, the first photoresist partially-reserved region b and the first photoresist completely-reserved region c respectively to form the patterns of the bridging layer 2 and the shielding layer 3 is preferably implemented in the following mode:

First of all, the thin film of the bridging layer 2 in the first photoresist completely-removed region a is removed by an etching process, and a pattern of the bridging layer 2 is obtained, as shown in FIG. 4c. The bridging layer 2 will bridge the adjacent touch sensing electrodes 51 manufactured in a subsequent preparing process. It should be noted that the etching process in the embodiments of the invention may be a wet etching process or a dry etching process.

Then, the photoresist 8 in the first photoresist partially-reserved region b is removed by an ashing process to expose the pattern of the bridging layer 2, and the thickness of the photoresist in the first photoresist completely-reserved region is thinned simultaneously by the ashing process to obtain the pattern of the shielding layer 3 (i.e., a completely-reserved region of the first photoresist that is thinned), as shown in FIG. 3a.

Preferably, during specific implementation, the material of the bridging layer 2 is a transparent conductive material, for example, it may be tin indium oxide (ITO), zinc indium oxide (IZO), carbon nanotube or graphene. The advantage of employing ITO as the material of the bridging layer 3 lies in that the transmittance of the touch screen panel can be improved, and since the light reflectivity of ITO is small relative to metal, the influence of the reflected light on human vision may be lowered. However, the bridging layer 2 may also be prepared by a metal material, which is not limited here.

In Step S102, that is, after Step S101, forming a pattern of an insulating layer 4 on the shielding layer 3 and the bridging layer 2 is preferably implemented in the following mode:

First of all, a thin film of an insulating layer 4 is deposited on the shielding layer 3 and the bridging layer 2.

Next, a photoresist is coated on the insulating layer 4.

Then, the photoresist on the insulating layer 4 is exposed through a mask 2 and developed, and the photoresist is removed to form the pattern of the insulating layer 4, as shown in FIG. 3b.

Figure 5A:
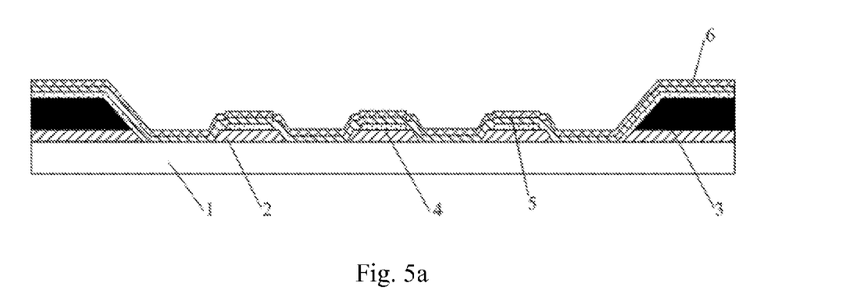
FIG. 5a-FIG. 5e are schematic sectional views showing each step of a process for forming a touch electrode layer and a peripheral wiring by one patterning process according to one embodiment of the invention.

In Step S103 and Step S104, that is., after Step S102, forming the patterns of a touch electrode layer 5 and a peripheral wiring 6 on the insulating layer 4 by one patterning process is preferably implemented in the following mode:

First of all, a thin film of a touch electrode layer 5 and a thin film of a peripheral wiring 6 are in turn formed on the insulating layer 4, as shown in FIG. 5a.

Figure 5B:
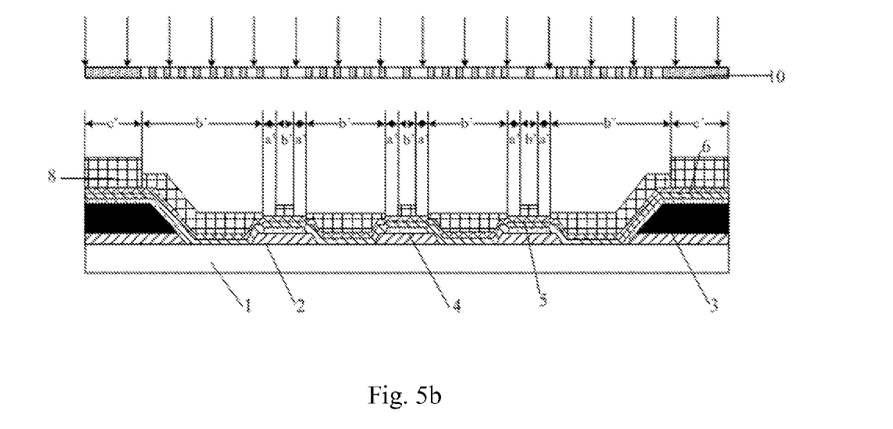

Then, a photoresist 8 is formed on the thin film of the peripheral wiring 6, and the photoresist 8 is exposed through a mask 3 (i.e., the second mask 10) and developed. As shown in FIG. 5b, a second photoresist completely-removed region a', a second photoresist partially-reserved region b' and a second photoresist completely-reserved region c' are obtained. During specific implementation, the second mask 10 may be a halftone mask or a graytone mask. The second photoresist partially-reserved region b' corresponds to the pattern that forms the touch electrode layer 5, and the second photoresist completely-reserved region c' corresponds to the pattern region that forms the peripheral wiring 6.

Finally, the second photoresist completely-removed region a', the second photoresist partially-reserved region b' and the second photoresist completely-reserved region c' are etched respectively to form the patterns of the touch electrode layer 5 and the peripheral wiring 6.

Figure 5C:
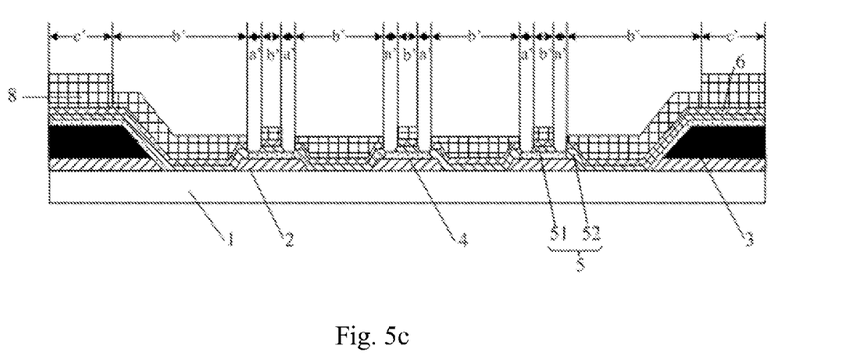

Moreover, the step of etching the second photoresist completely-removed region a', the second photoresist partially-reserved region b' and the second photoresist completely-reserved region c' respectively to form the patterns of the touch electrode layer 5 and the peripheral wiring 6 is preferably implemented in the following mode:

First of all, the thin films of the touch electrode layer 5 and the thin film of the peripheral wiring 6 in the second photoresist completely-removed region a' are removed through an etching process to obtain a pattern of a touch electrode layer 5. As shown in FIG. 5c, the touch electrode layer 5 includes a touch sensing electrode 51 and a touch driving electrode 52 that are formed crosswise and insulated from each other.

Figure 5D:
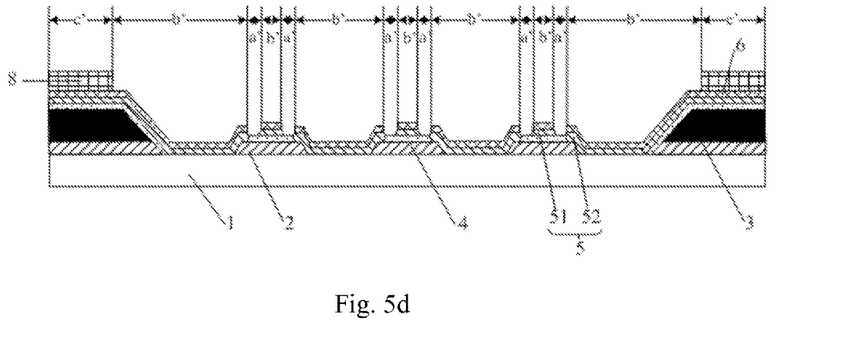

Then, the photoresist in the second photoresist partially-reserved region b' is removed by an ashing process, and the photoresist in the second photoresist completely-reserved region c' is thinned, as shown in FIG. 5d.

Figure 5E:
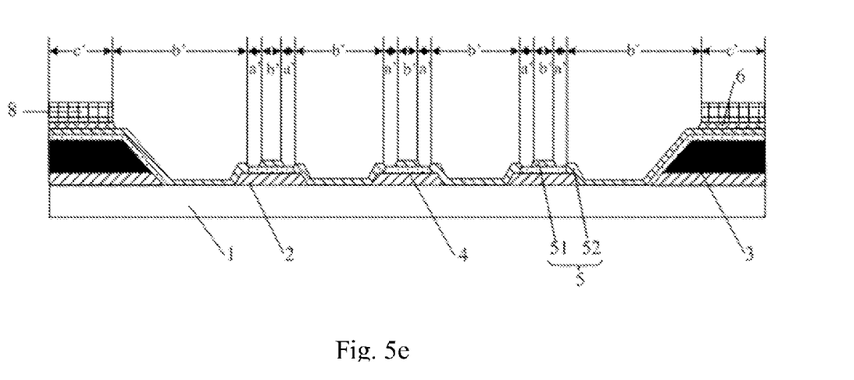

Next, the thin film of the peripheral wiring 6 in the second photoresist partially-reserved region b' is removed by an etching process to expose the pattern of the touch electrode layer 5, as shown in FIG. 5e.

Finally, the photoresist 8 in the second photoresist completely-reserved region c' is peeled off, and a pattern of a peripheral wiring 6 is obtained, as shown in FIG. 3d.

Preferably, during specific implementation, the material of the touch electrode layer 5 is a transparent conductive material, for example, it may be tin indium oxide (ITO) or zinc indium oxide (IZO), and it may also be a transparent conductive material such as carbon nanotube and graphene, etc.

In Step S105, that is, after Step S104, forming a pattern of a passivation layer 7 on the peripheral wiring 6 is preferably implemented in the following mode:

First of all, a thin film of a passivation layer 7 is deposited on the peripheral wiring 6.

Then, the thin film of the passivation layer 7 is patterned through a mask 4 to form a pattern of the passivation layer 7, as shown in FIG. 3e. The passivation layer 7 may protect the peripheral wiring 6 from being oxidized by the air from the outside.

Based on the same inventive conception, an embodiment of the invention further provides a touch screen panel prepared by the above method for manufacturing a touch screen panel. As shown in FIG. 3e, the touch screen panel specifically includes: a substrate 1, and a bridging layer 2, a shielding layer 3, an insulating layer 4 and a touch electrode layer 5 that are stacked in turn on the substrate 1; wherein:

The bridging layer 2, the insulating layer 4 and the touch electrode layer are located in a touch region A and a non-touch region B of the touch screen panel. The touch electrode layer 5 includes a touch sensing electrode 51 and a touch driving electrode 52 that are formed crosswise on the same layer, and insulated from each other. The bridging layer 2 bridges the adjacent touch driving electrodes 52 or the adjacent touch sensing electrodes 51. In FIG. 3e, it is illustrated by an example in which the bridging layer 2 bridges the adjacent touch sensing electrodes 51.

The shielding layer 3 is located in the non-touch region B of the touch screen panel. It may be seen from FIG. 3e that the shielding layer 3 is only formed in the non-touch region B of the touch screen panel.

Moreover, as shown in FIG. 3e, the above touch screen panel may further include a peripheral wiring 6, which is located in the non-touch region B of the touch screen panel and on the touch electrode layer 5.

Moreover, as shown in FIG. 3e, the above touch screen panel may further include a passivation layer 7, which is located on the peripheral wiring 6 and covers the touch region A and the non-touch region B. Moreover, the peripheral wiring is preferably a metal wiring, because a metal has a small resistance and a better conduction effect, which is favorable for improving the touch sensitivity of the touch screen panel.

Moreover, in this embodiment, the material of the shielding layer 3 of the touch screen panel may be a black photosensitive resin, thus the black photosensitive resin may be used as a photoresist in a mask process simultaneously, and a process for separately coating a photoresist can be omitted, the consumption of the photoresist cam be reduced, and the production cost can be saved.

Moreover, the material of the bridging layer 2 in the touch screen panel may be a transparent conductive material, for example, it may be tin indium oxide (ITO), zinc indium oxide (IZO), carbon nanotube or graphene; or, it may be a metal material. The advantage of using ITO as the material of the bridging layer 2 lies in that the transmittance of the touch screen panel can be improved, and since the light reflectivity of ITO is small relative to metal, the influence of the reflected light on human vision can be lowered. The material of the bridging layer 2 may be a metal, and since a metal has a resistance smaller than that of ITO, it is favorable for lowering the resistance of the touch electrode layer and improving the touch sensitivity. However, a metal is generally light-tight, thus the transmittance of the touch screen panel will be influenced.

In the structure of the above touch screen panel, the bridging layer 2 and the shielding layer 3 may be prepared by one patterning process, that is, the patterns of two films may be prepared through a graytone mask or a halftone mask. The specific preparation method is the same as that of the former embodiment, and no further detailed description will be given here. Thus, in comparison with the six patterning processes employed in the prior art, the number of times the masks are used can be reduced, so that the manufacture efficiency of the touch screen panel can be improved, and the production cost can be lowered.

Moreover, the material of the touch electrode layer 5 in the touch screen panel may be a transparent conductive material, for example, it may be tin indium oxide (ITO) or zinc indium oxide (IZO), or it may be a transparent conductive material such as carbon nanotube and graphene, etc. Thus, the touch electrode layer 5 and the peripheral wiring 6 may be prepared by one patterning process, that is, the patterns of two films may be prepared through a graytone mask or a halftone mask. The specific preparation method is the same as that of the former embodiment, and no further detailed description will be given here. Thus, in comparison with the six patterning processes employed in the prior art, the number of times the masks are used can be reduced, so that the manufacture efficiency of the touch screen panel can be improved, and the production cost can be lowered.

Based on the same inventive conception, an embodiment of the invention further provides a display device, which includes the above touch screen panel according to the embodiments of the invention. The display device may be any product or component that has a display function, for example, mobile phone, tablet computer, TV set, display, notebook computer, digital photo frame and navigator, etc. For the implementation of the display device, reference may be made to the embodiments of the above touch screen panel, and no further repeated description will be given here.

The embodiments of the invention provide a touch screen panel and a method for manufacturing the same, and a display device, wherein the manufacturing method includes: forming the patterns of a bridging layer and a shielding layer on a substrate by one patterning process; then forming a pattern of an insulating layer on the shielding layer; and forming a pattern of a touch electrode layer on the insulating layer. In the embodiments of the invention, the patterning of the bridging layer and the shielding layer is accomplished simultaneously in one patterning process, thus the number of patterning times during the manufacture process may be reduced, the manufacture efficiency of the touch screen panel can be improved, and the production cost can be lowered.

Apparently, various variations and modifications may be made on the invention by a person skilled in the art without departing from the spirit and scope of the invention. Thus, if these modifications and variations belong to the scope of the claims of the invention and their equivalents, they are also intended to be contemplated by the invention.

What is claimed is:

1. A method for manufacturing a touch screen panel, comprising:
    forming patterns of a bridging layer and a shielding layer on a substrate by one patterning process;
    forming a pattern of an insulating layer on the shielding layer and the bridging layer;
    forming a pattern of a touch electrode layer on the insulating layer, wherein the touch electrode layer comprises a touch sensing electrode and a touch driving electrode that are formed crosswise and insulated from each other, and the bridging layer bridges an adjacent touch driving electrode or an adjacent touch sensing electrode; and
    forming a pattern of a peripheral wiring on the touch electrode layer,
        wherein the step of forming a pattern of a touch electrode layer on the insulating layer and the step of forming a pattern of a peripheral wiring on the touch electrode are accomplished in one patterning process.

2. The method according to claim 1, further comprising:
    forming a pattern of a passivation layer on the peripheral wiring.

3. The method according to claim 1, wherein the step of forming patterns of a bridging layer and a shielding layer on a substrate by one patterning process comprises:
    forming a thin film of the bridging layer on the substrate;
    forming a photoresist on the thin film of the bridging layer, exposing the photoresist through a first mask and developing, and obtaining a first photoresist completely-removed region, a first photoresist partially-reserved region and a first photoresist completely-reserved region, wherein the first photoresist partially-reserved region corresponds to a pattern region that forms the bridging layer, and the first photoresist completely-reserved region corresponds to a pattern region that forms the shielding layer; and etching the first photoresist completely-removed region, the first photoresist partially-reserved region and the first photoresist completely-reserved region respectively and forming the patterns of the bridging layer and the shielding layer.

4. The method according to claim 3, wherein the first mask is a halftone mask or a graytone mask.

5. The method according to claim 3, wherein the photoresist is a black photosensitive resin.

6. The method according to claim 5, wherein the step of etching the first photoresist completely-removed region, the first photoresist partially-reserved region and the first photoresist completely-reserved region respectively and forming the patterns of a bridging layer and a shielding layer comprises:

removing the thin film of the bridging layer of the first photoresist completely-removed region by an etching process, and obtaining a pattern of the bridging layer; and removing the photoresist in the first photoresist partially-reserved region by an ashing process to expose the pattern of the bridging layer, thinning a thickness of the photoresist in the first photoresist completely-reserved region simultaneously, and obtaining a pattern of the shielding layer.

7. The method according to claim 1, wherein the step of forming the patterns of a touch electrode layer and a peripheral wiring on the insulating layer by one patterning process comprises:

forming a thin film of a touch electrode layer and a thin film of a peripheral wiring in turn on the insulating layer;

forming a photoresist on the thin film of the peripheral wiring, exposing the photoresist through a second mask and developing, and obtaining a second photoresist completely-removed region, a second photoresist partially-reserved region and second photoresist completely-reserved region, wherein the second photoresist partially-reserved region corresponds to a pattern region that forms the touch electrode, and the second photoresist completely-reserved region corresponds to a pattern region that forms the peripheral wiring; and etching the second photoresist completely-removed region, the second photoresist partially-reserved region and the second photoresist completely-reserved region respectively, and forming the patterns of the touch electrode layer and the peripheral wiring.

8. The method according to claim 7, wherein the second mask is a halftone mask or a graytone mask.

9. The method according to claim 8, wherein the step of etching the second photoresist completely-removed region, the second photoresist partially-reserved region and the second photoresist completely-reserved region respectively and forming the patterns of the touch electrode layer and the peripheral wiring comprises:

removing the thin film of the touch electrode layer and the thin film of the peripheral wiring from the second photoresist completely-removed region, and obtaining a pattern of the touch electrode layer;

removing the photoresist from the second photoresist partially-reserved region, and thinning the photoresist in the second photoresist completely-reserved region simultaneously; and removing the thin film of the peripheral wiring from the second photoresist partially-reserved region to expose the pattern of the touch electrode layer, peeling off the photoresist in the second photoresist completely-reserved region, and obtaining the pattern of the peripheral wiring.

10. The method according to claim 8, wherein the step of etching the second photoresist completely-removed region, the second photoresist partially-reserved region and the second photoresist completely-reserved region respectively and forming the patterns of the touch electrode layer and the peripheral wiring comprises:

removing the thin film of the touch electrode layer and the thin film of the peripheral wiring from the second photoresist completely-removed region, and obtaining a pattern of the touch electrode layer;

removing the photoresist from the second photoresist partially-reserved region, and thinning the photoresist in the second photoresist completely-reserved region simultaneously; and removing the thin film of the peripheral wiring from the second photoresist partially-reserved region to expose the pattern of the touch electrode layer, peeling off the photoresist in the second photoresist completely-reserved region, and obtaining the pattern of the peripheral wiring.

11. The method according to claim 1, wherein the step of forming patterns of a bridging layer and a shielding layer on a substrate by one patterning process comprises:

forming a thin film of the bridging layer on the substrate;

forming a photoresist on the thin film of the bridging layer, exposing the photoresist through a first mask and developing, and obtaining a first photoresist completely-removed region, a first photoresist partially-reserved region and a first photoresist completely-reserved region, wherein the first photoresist partially-reserved region corresponds to a pattern region that forms the bridging layer, and the first photoresist completely-reserved region corresponds to a pattern region that forms the shielding layer; and etching the first photoresist completely-removed region, the first photoresist partially-reserved region and the first photoresist completely-reserved region respectively and forming the patterns of the bridging layer and the shielding layer.

12. A touch screen panel, comprising: a substrate, and a bridging layer, a shielding layer, an insulating layer and a touch electrode layer that are stacked in turn on the substrate;

patterns of a bridging layer and a shielding layer on a substrate are formed by one patterning process;

wherein the step of forming a pattern of a touch electrode layer on the insulating layer and the step of forming a pattern of a peripheral wiring on the touch electrode are accomplished in one patterning process, wherein:

the bridging layer, the insulating layer and the touch electrode layer are located in a touch region and a non-touch region of the touch screen panel, the touch electrode layer comprises a touch sensing electrode and a touch driving electrode that are formed crosswise on a same layer and insulated from each other, and the bridging layer bridges an adjacent touch driving electrode electrodes or an adjacent touch sensing electrode electrodes;

the shielding layer is located in the non-touch region of the touch screen panel; and the touch screen panel further comprises a peripheral wiring, which is located in the non-touch region of the touch screen panel and on the touch electrode layer.

13. The touch screen panel according to claim 12, further comprising: a passivation layer, which is located on the peripheral wiring and covers the touch region and the non-touch region.

14. The touch screen panel according to claim 12, wherein a material of the shielding layer is a black photosensitive resin.

15. The touch screen panel according to claim 12, wherein a material of the bridging layer and/or the touch electrode layer is a transparent conductive material.

16. The touch screen panel according to claim 15, wherein the transparent conductive material is tin indium oxide, zinc indium oxide, carbon nanotube or graphene.

17. A display device, comprising a touch screen panel according to claim 12.

* * * * *